(12) United States Patent
Chang et al.

(10) Patent No.: US 9,537,021 B2
(45) Date of Patent: Jan. 3, 2017

(54) PHOTOVOLTAIC CELL

(71) Applicant: EPISTAR CORPORATION, Hsinchu (TW)

(72) Inventors: Ming-Nan Chang, Hsinchu (TW); Cheng-Hong Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 242 days.

(21) Appl. No.: 13/894,980

(22) Filed: May 15, 2013

(65) Prior Publication Data

US 2013/0319519 A1   Dec. 5, 2013

(30) Foreign Application Priority Data

May 30, 2012   (TW) .............................. 101119652 A

(51) Int. Cl.
*H01L 31/0224*   (2006.01)
*H01L 31/054*   (2014.01)

(52) U.S. Cl.
CPC ..... *H01L 31/022433* (2013.01); *H01L 31/054* (2014.12); *Y02E 10/52* (2013.01)

(58) Field of Classification Search
None
See application file for complete search history.

(56) References Cited

U.S. PATENT DOCUMENTS

| | | | | |
|---|---|---|---|---|
| 3,622,844 A | * | 11/1971 | Barelli | H01L 21/00 257/438 |
| 4,115,149 A | * | 9/1978 | Bell | 136/259 |
| 4,180,414 A | * | 12/1979 | Diamond et al. | 136/246 |
| 4,227,940 A | * | 10/1980 | Ling et al. | 136/256 |
| 4,320,250 A | * | 3/1982 | Corwin et al. | 136/256 |
| 4,487,989 A | * | 12/1984 | Wakefield | H01L 31/02243 136/256 |
| 4,834,805 A | * | 5/1989 | Erbert | 136/246 |
| 6,573,445 B1 | * | 6/2003 | Burgers | 136/256 |
| 2002/0113250 A1 | * | 8/2002 | Chaiken | G11B 7/2433 257/200 |

(Continued)

FOREIGN PATENT DOCUMENTS

| | | |
|---|---|---|
| CN | 101093864 A | 12/2007 |
| TW | M370833 U | 12/2009 |
| WO | WO 2011024264 A1 * | 3/2011 |

OTHER PUBLICATIONS

Definition of "surround" [retrieved from http://www.thefreedictionary.com/surround on Feb. 17, 2016].*

*Primary Examiner* — Eric R Smith
(74) *Attorney, Agent, or Firm* — Patterson + Sheridan, LLP

(57) ABSTRACT

A concentrated photovoltaic cell comprises a semiconductor stack comprising an upper surface and a lower surface opposite to the upper surface, wherein the upper surface is operable to absorb a light which comprises a light intensity distribution on the upper surface; and an upper electrode formed on the upper surface of the semiconductor stack and comprising an electrode pattern approximately corresponding to the light intensity distribution, wherein the light intensity distribution comprises a high light-concentrated area having a first light intensity and a low light-concentrated area having a second light intensity, wherein the second light intensity is lower than the first light intensity.

15 Claims, 9 Drawing Sheets

(56) References Cited

U.S. PATENT DOCUMENTS

| | | | |
|---|---|---|---|
| 2007/0256725 A1* | 11/2007 | Fork | F24J 2/18 |
| | | | 136/246 |
| 2008/0023061 A1* | 1/2008 | Clemens et al. | 136/246 |
| 2008/0092942 A1* | 4/2008 | Kinsey et al. | 136/252 |
| 2009/0235976 A1* | 9/2009 | Ludowise | H01L 31/02242 |
| | | | 136/252 |
| 2011/0017263 A1* | 1/2011 | Gibson et al. | 136/246 |
| 2011/0023958 A1* | 2/2011 | Masson et al. | 136/256 |
| 2011/0247688 A1* | 10/2011 | Yoon et al. | 136/256 |
| 2011/0277835 A1* | 11/2011 | Masson et al. | 136/256 |
| 2012/0125420 A1* | 5/2012 | Karakida | 136/255 |

\* cited by examiner

PHOTOVOLTAIC CELL

REFERENCE TO RELATED APPLICATION

This application claims the right of priority based on TW application Serial No. 101119652, filed on May 30, 2012, and the content of which is hereby incorporated by reference in its entirety.

TECHNICAL FIELD

The application relates to a concentrated photovoltaic cell, and more particularly, to a concentrated photovoltaic cell comprising a semiconductor stack comprising an upper surface, wherein the upper surface is operable to absorb a light which comprises a light intensity distribution on the upper surface; and an upper electrode comprising an electrode pattern approximately corresponding to the light intensity distribution.

DESCRIPTION OF BACKGROUND ART

Due to the shortage of fossil energy, countries around the world are aware of the importance of the environmental protection. In recent years, alternative energy and renewable energy technologies are developed, wherein the photovoltaic cell gets much attention. The photovoltaic cell directly converts solar energy into electrical energy. When the amount of the sunlight is greater and the concentration magnification of the concentrator module is higher, the electricity per unit area of the photovoltaic cell is higher and the cost of power generation of the photovoltaic cell is cheaper.

The conversion efficiency of the photovoltaic cells differs when that material of the photovoltaic cells changes. For example, the conversion efficiency of a silicon-based photovoltaic cell is about 12%~20%, and the conversion efficiency of a group III-V based photovoltaic cell is about 31%~41%. The silicon material absorbs energy having wavelength between 400 nm and 1100 nm, and the group III-V material absorbs energy having wavelength between 300 nm and 1900 nm. The conversion efficiency of the group III-V based photoelectric cell is higher compared with the silicon-based photovoltaic cell.

The concentrated photovoltaic cell generates power by focusing the sunlight on the group III-V based photovoltaic cell through optical concentrator so the power generation efficiency of the photovoltaic cell is increased and the cost of the power generation is reduced. Taking a photovoltaic cell having a size of 4 inches wafer and comprising group III-V based material for example, it can produce 2.4 W power under one sun without the optical concentrator and 650 W power under 500 suns with the optical concentrator. In this case, the concentration magnification of the optical concentrator is expressed with multiples of sun. For example, 500 suns expressed that the light intensity received by the photovoltaic cell with the optical concentrator is 500 times of that without the optical concentrator under the same unit area.

FIG. 1 illustrates a diagram of a conventional concentrator module 1. The concentrator module 1 comprises a first optical concentrator 13, a second optical concentrator 11 and a photovoltaic cell 10. FIG. 2 illustrates a top-viewed diagram of the photovoltaic cell 10. The photovoltaic cell 10 comprises a plurality of collector electrodes 102 and a plurality of grid electrodes 103 formed on an upper surface 101. FIG. 2A illustrates a partial enlargement of a top-viewed diagram of the plurality of grid electrodes 103. Each of the plurality of grid electrodes 103 comprises a same width w, and a spacing s between adjacent grid electrodes 103 is the same. A pitch d between the first grid electrode 103a and the second grid electrode 103b is the sum of the width w and the spacing s. As shown in FIG. 2A, the pitch d between the plurality of grid electrodes 103 is the same.

The first optical concentrator 13 and the second optical concentrator 11 focuses a sunlight 12 on the upper surface 101 of the photovoltaic cell 10 with high concentration magnification, which achieves higher photoelectric conversion efficiency, provides higher power generation and reduces the costs of power generation. However, the light concentration of the conventional concentrator module 1 is uneven. When the sunlight 12 is incident on the upper surface 101 of the photovoltaic cell 10, the light intensity distribution of the sunlight 12 is uneven on the upper surface 101, which leads to higher resistance of the photovoltaic cell 10 and reduces the power generation efficiency of the photovoltaic cell 10 as a whole. FIG. 3 illustrates an example of the conventional photovoltaic cell 10 with the conventional concentrator module 1. FIG. 3 shows an example of the photovoltaic cell 10 having a size 5 mm×5 mm. The photovoltaic cell 10 receives the sunlight 12 from the concentrator module 1. Within a radius of 1 mm from the center of the upper surface 101 of the photovoltaic cell 10, the concentration magnification of the sunlight 12 incident on the photovoltaic cell 10 by the first optical concentrator 13 and the second optical concentrator 11 is more than 1000 suns. Beyond a radius of 1 mm from the center of the upper surface 101 of the photovoltaic cell 10, the concentration magnification of the sunlight 12 incident on the photovoltaic cell 10 by the first optical concentrator 13 and the second optical concentrator 11 is less than 200 suns.

SUMMARY OF THE APPLICATION

A concentrated photovoltaic cell comprises a semiconductor stack comprising an upper surface and a lower surface opposite to the upper surface, wherein the upper surface is operable to absorb a light which comprises a light intensity distribution on the upper surface; and an upper electrode formed on the upper surface of the semiconductor stack and comprising an electrode pattern approximately corresponding to the light intensity distribution, wherein the light intensity distribution comprises a high light-concentrated area having a first light intensity and a low light-concentrated area having a second light intensity, wherein the second light intensity is lower than the first light intensity.

DETAILED DESCRIPTION OF PREFERRED EMBODIMENTS

Figure 1:
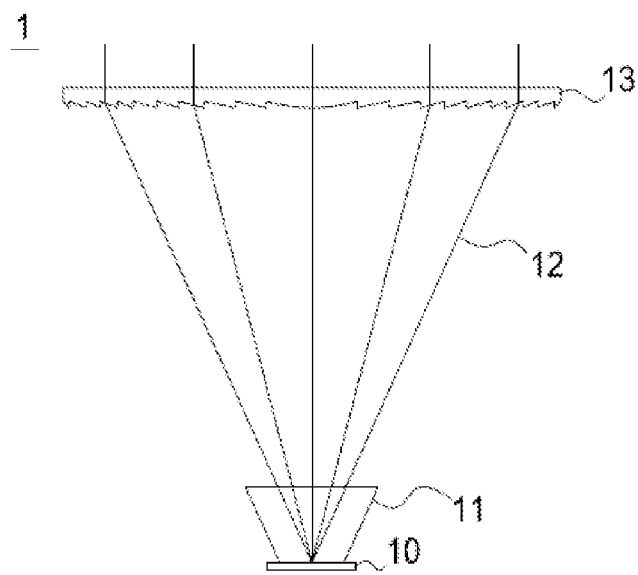
FIG. 1 illustrates a diagram of a conventional concentrator module.
Figure 2:
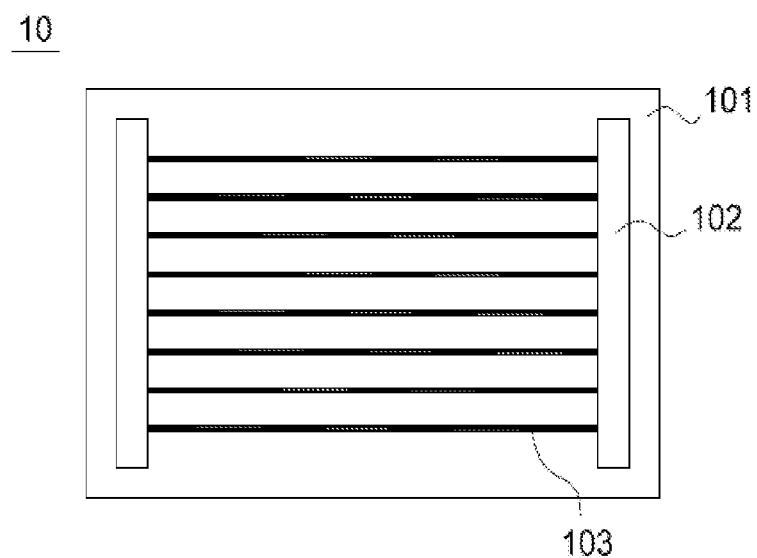
FIG. 2 illustrates a top-viewed diagram of a conventional photovoltaic cell.
Figure 2A:
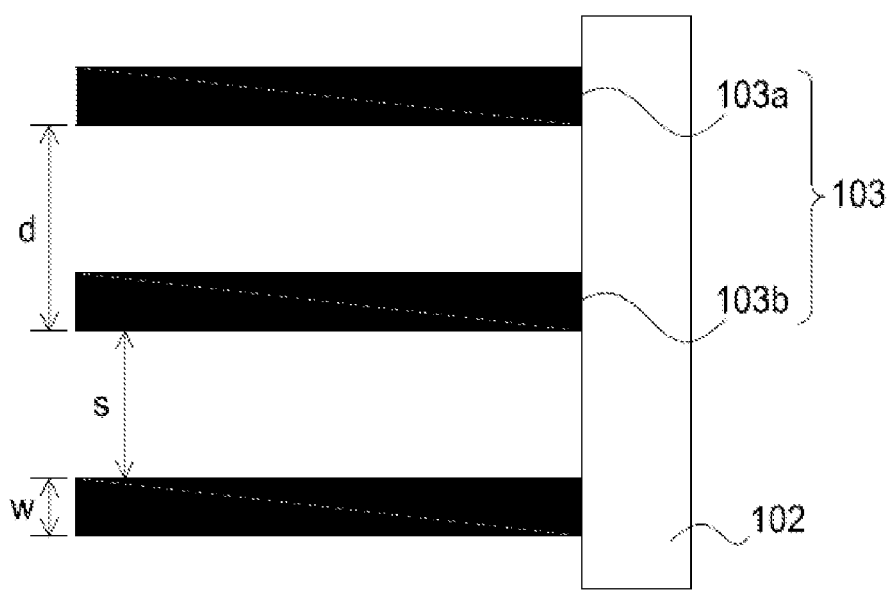
FIG. 2A illustrates a partial enlargement of a top-viewed diagram of a conventional photovoltaic cell.
Figure 3:
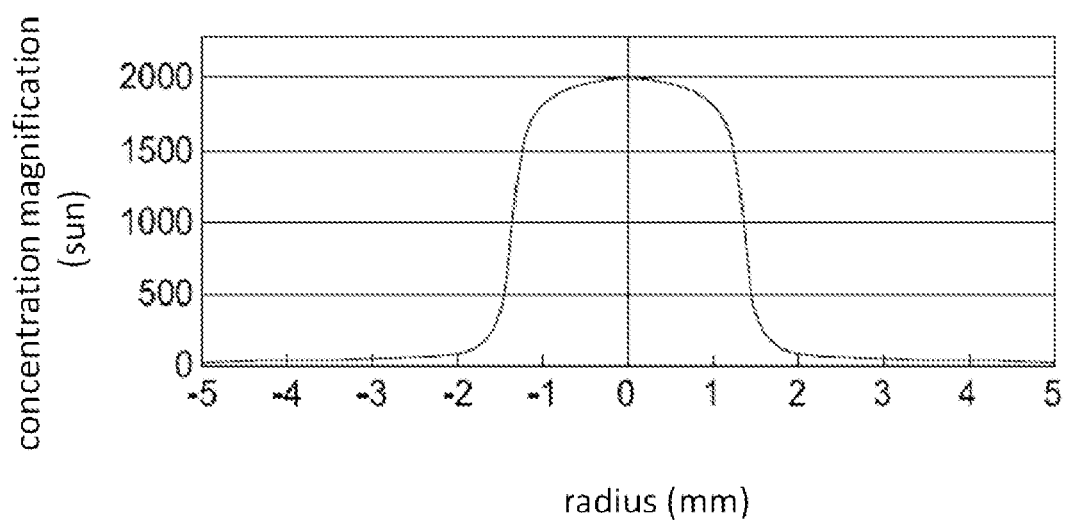
FIG. 3 illustrates an example of a conventional photovoltaic cell with a conventional concentrator module.

The embodiment of the application is illustrated in detail, and is plotted in the drawings. The same or the similar part is illustrated in the drawings and the specification with the same number.

Figure 4:
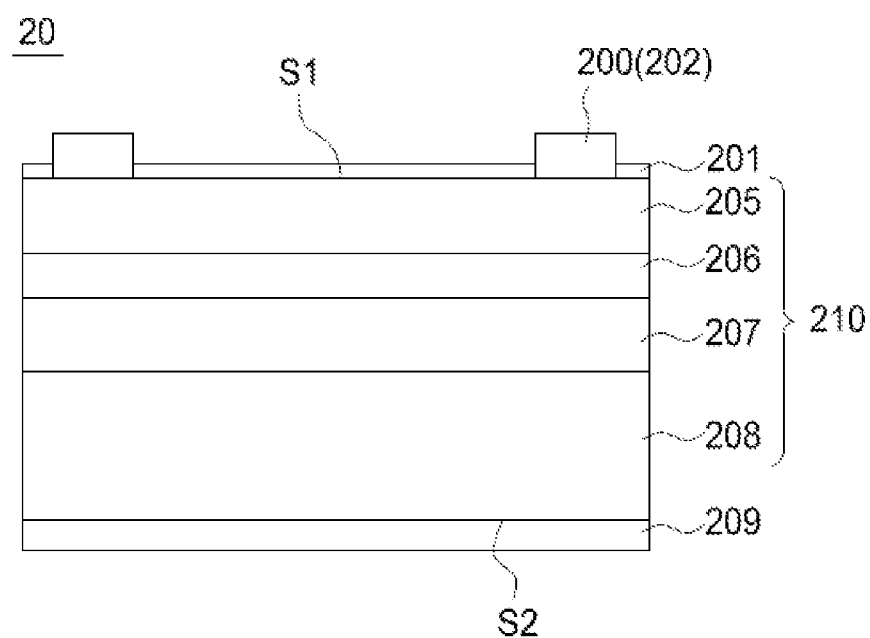
FIG. 4 illustrates a cross-sectional diagram of a concentrated photovoltaic cell in accordance with a first embodiment of the present application.
Figure 5:
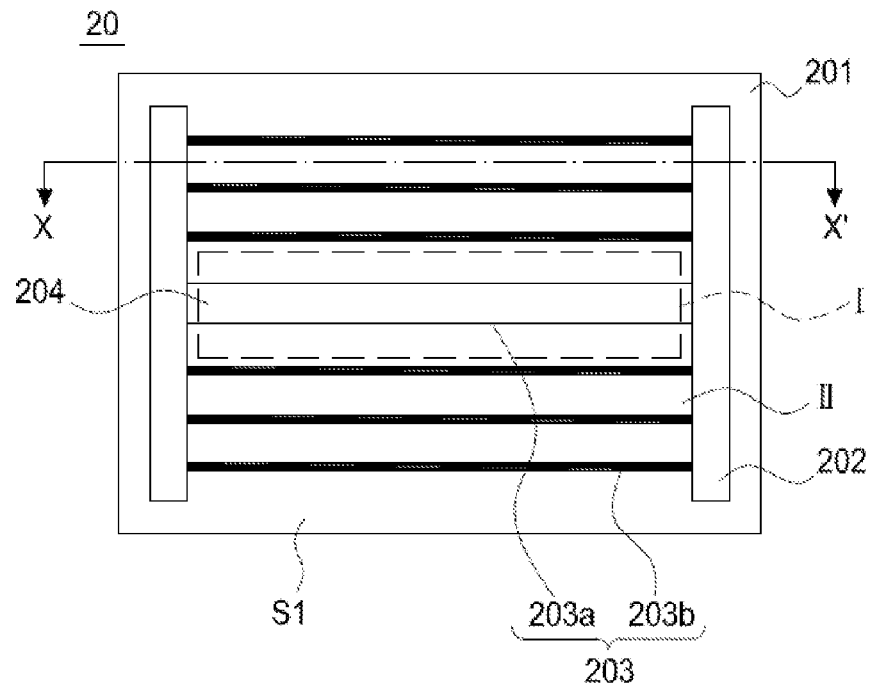
FIG. 5 illustrates a top-viewed diagram of a concentrated photovoltaic cell in accordance with a first embodiment of the present application.

FIG. 4 illustrates a cross-sectional diagram of a concentrated photovoltaic cell 20 in accordance with a first embodiment of the present application. FIG. 5 illustrates a top-viewed diagram of the concentrated photovoltaic cell 20 in accordance with the first embodiment of the present application. FIG. 4 illustrates the cross-sectional diagram alone line X-X' of FIG. 5. As shown in FIG. 4, the concentrated photovoltaic cell 20 is operable to absorb a light, such as sunlight. The concentrated photovoltaic cell 20 comprises a semiconductor stack 210 comprising an upper surface S1 and a lower surface S2 opposite to the upper surface S1, wherein the upper surface S1 is formed near a side where the light incident thereon and operable to absorb the light, and the light incident on the upper surface S1 comprises a light intensity distribution; an upper electrode 200 formed on the upper surface S1 of the semiconductor stack 210; a lower electrode 209 formed on the lower surface S2 of the semiconductor stack 210; and an anti-reflective layer 201 formed on the upper surface S1 of the semiconductor stack 210. The anti-reflective layer 201 comprises dielectric materials, such as silicon nitride ($SiN_x$), silicon oxide ($SiO_2$), aluminum oxide ($Al_2O_3$), or titanium oxide ($TiO_x$). The anti-reflective layer 201 reduces reflection of the light on the upper surface S1. The material of the upper electrode 200 and the lower electrode 209 comprises metal, such as titanium, platinum, nickel, gold, or silver, which can be formed on the semiconductor stack 210 by electroplating, vapor deposition, or sputter.

The semiconductor stack 210 comprises one junction or multiple junctions. As shown in FIG. 4, the semiconductor stack 210 comprises a window layer 205 formed on a side near the anti-reflective layer 201, a top subcell 206, a middle subcell 207, and a bottom subcell 208 formed on a side near the lower electrode 209. The material of the semiconductor stack 210 comprises group III or group V element, such as arsenic (As), gallium (Ga), aluminum (Al), indium (In), phosphorus (P), or nitrogen (N). The semiconductor stack 210 may be formed by a known epitaxy method such as metallic-organic chemical vapor deposition (MOCVD) method, a molecular beam epitaxy (MBE) method, a hydride vapor phase epitaxy (HVPE) method, sputtering, or electrical plating.

The window layer 205 directs the light incident on the upper surface S1 of the semiconductor stack 210 towards the top subcell 206, the middle subcell 207, and the bottom subcell 208. The top subcell 206, the middle subcell 207, and the bottom subcell 208 absorb the light and convert that into an electrical current. The upper electrode 200 and the lower electrode 209 collect and export the electrical current provided from the top subcell 206, the middle subcell 207, and the bottom subcell 208.

As shown in FIG. 5, the upper electrode 200 comprises a plurality of collector electrodes 202 and a plurality of grid electrodes 203. An electrode pattern of the upper electrode 200 is related with resistance, fill factor (FF), or short-circuit current ($I_{sc}$) of the concentrated photovoltaic cell 20. A width or a pitch of the plurality of grid electrodes 203 can be adjusted to change the light shielding area of the upper electrode 200. FIG. 5 illustrates the top-viewed diagram of the concentrated photovoltaic cell 20 in accordance with the first embodiment of the present application. The upper electrode 200 comprises an electrode pattern approximately corresponding to an intensity distribution of the light absorbed by the upper surface S1, wherein the light intensity distribution comprises a high light-concentrated area I having a first light intensity and a low light-concentrated area II having a second light intensity, wherein the second light intensity is lower than the first light intensity. The electrode pattern comprises a first electrode area 204 and a second electrode area 201 different from the first electrode area 204. The first electrode area 204 and the second electrode area 201 are approximately corresponding to the high light-concentrated area I and the low light-concentrated area II respectively. The first electrode area 204 comprises an area disposed on a center area of the upper surface S1. The plurality of grid electrodes 203 and the plurality of collector electrodes 202 are formed by lithography, wherein the plurality of collector electrodes 202 comprises a width larger than 50 μm, preferably larger than 100 μm.

As shown in FIG. 5, a ratio of the first electrode area 204 and the upper surface S1 is not larger than 80%. An optical concentrator (not shown) having a concentration magnification, such as at least 200 suns above, is disposed on the semiconductor stack 210 near a side where the sunlight incident thereon. The high light-concentrated area I comprises a concentration magnification larger than that of the optical concentrator, such as 200 suns above; and the low light-concentrated area II comprises a concentration magnification lower than that of the optical concentrator, such as 200 suns below. The plurality of grid electrodes 203 and the plurality of collector electrodes 202 are perpendicular to each other, and the grid electrodes 203 are parallel to each other. The width of the plurality of grid electrodes 203 in the first electrode area 204 is smaller than that in the second electrode area 201. The pitch of the plurality of grid electrodes 203 in the first electrode area 204 is equal to that in the second electrode area 201.

Figure 6:
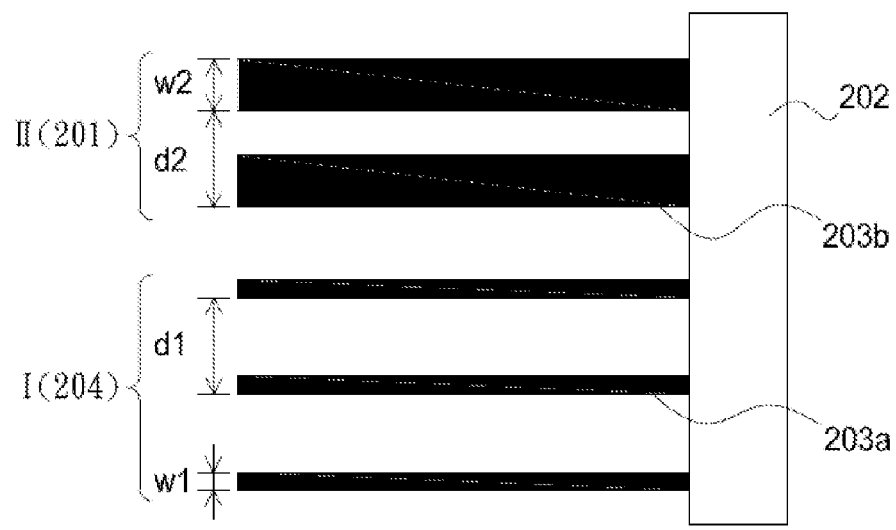
FIG. 6 illustrates a partial enlargement of a top-viewed diagram of a concentrated photovoltaic cell in accordance with a first embodiment of the present application.

FIG. 6 illustrates a partial enlargement of a top-viewed diagram of the plurality of grid electrodes 203 shown in FIG.

5. As shown in FIG. 6, the pitch of a plurality of grid electrodes 203a in the first electrode area 204 (the high light-concentrated area I) is d1, the pitch of a plurality of grid electrodes 203b in the second electrode area 201 (the low light-concentrated area II) is d2. In the embodiment, the width w1 of the plurality of grid electrodes 203a in the first electrode area 204 is smaller than the width w2 in the second electrode area 201, and the pitch d1 of the plurality of grid electrodes 203a is equal to the pitch d2 of the plurality of grid electrodes 203b. The pitch d1 of the plurality of grid electrodes 203a in the first electrode area 204 or the pitch d2 of the plurality of grid electrodes 203b in the second electrode area 201 is between 50 μm~300 μm, preferably between 90 μm~200 μm. In the embodiment, the width w1 of the plurality of grid electrodes 203 in the first electrode area 204 is smaller than the width w2 of the plurality of grid electrodes 203 in the second electrode area 201, which reduces light shielding area of the plurality of grid electrodes 203 in the high light-concentrated area I and increases short-circuit current ($I_{sc}$) of the concentrated photovoltaic cell 20.

Figure 7:
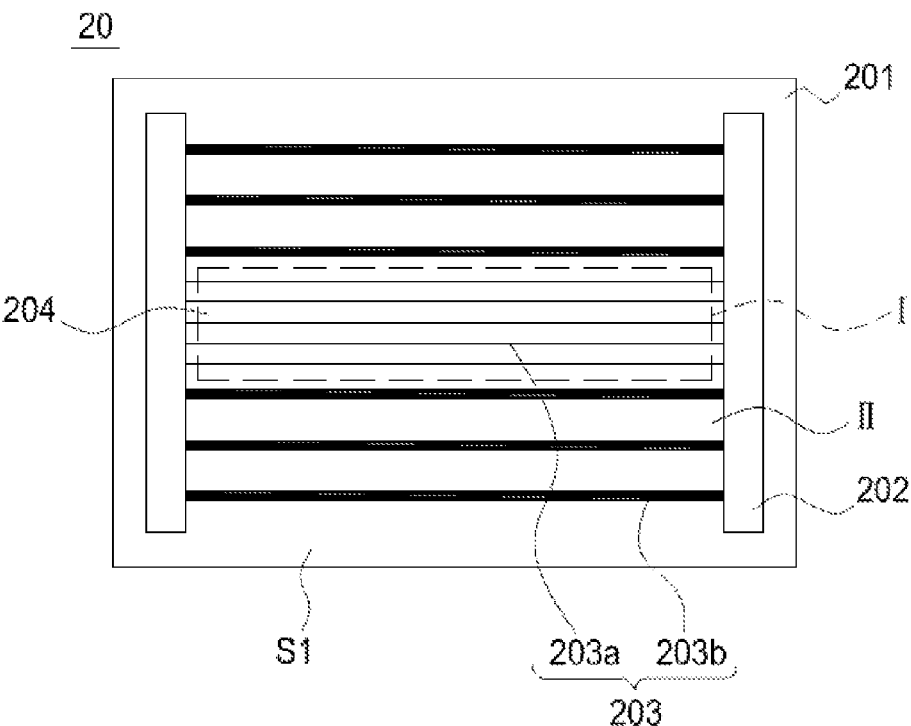
FIG. 7 illustrates a top-viewed diagram of a concentrated photovoltaic cell in accordance with a second embodiment of the present application.
Figure 8:
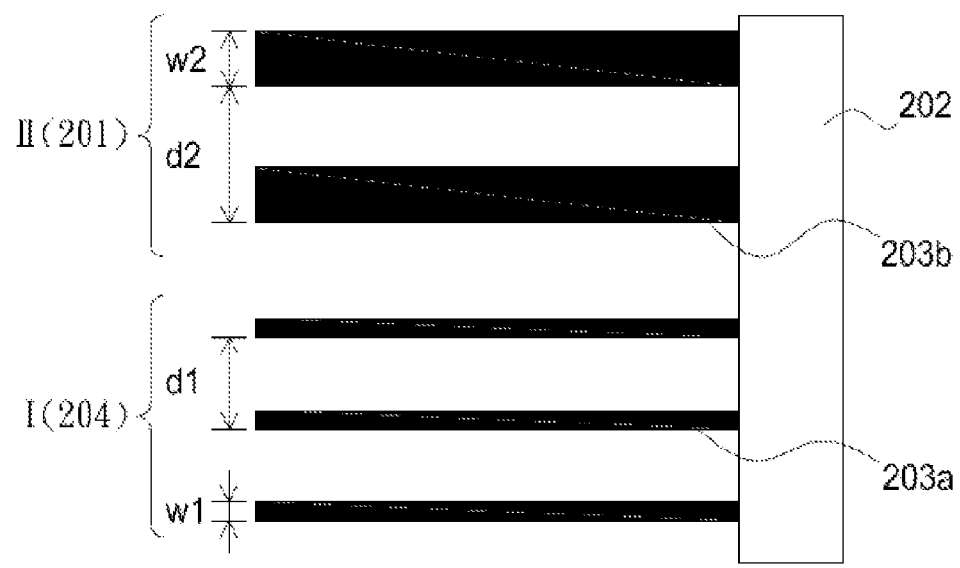
FIG. 8 illustrates a partial enlargement of a top-viewed diagram of a concentrated photovoltaic cell in accordance with a second embodiment of the present application.

FIG. 7 illustrates a top-viewed diagram of a concentrated photovoltaic cell 20 in accordance with a second embodiment of the present application. FIG. 8 illustrates a partial enlargement of a top-viewed diagram of a plurality of grid electrodes 203 shown in FIG. 7. As shown in FIG. 8, the pitch d1 of a plurality of grid electrodes 203a in the first electrode area 204 (the high light-concentrated area I) is smaller than the pitch d2 of a plurality of grid electrodes 203b in the second electrode area 201 (the low light-concentrated area II). The pitch d1 of the plurality of grid electrodes 203a in the first electrode area 204 (the high light-concentrated area I) is larger than 50 μm, preferably larger than 90 μm. The pitch d2 of the plurality of grid electrodes 203b in the second electrode area 201 (the low light-concentrated area II) is smaller than 300 μm, preferably smaller than 200 μm. In the embodiment, the width w1 of the plurality of grid electrodes 203a in the first electrode area 204 is smaller than the width w2 of the plurality of grid electrodes 203b in the second electrode area 201, which reduces light shielding area of the plurality of grid electrodes 203a in the high light-concentrated area I. The pitch d2 of the plurality of grid electrodes 203 in the second electrode area 201 is larger than the pitch d1 of the plurality of grid electrodes 203 in the first electrode area 204, which reduces light shielding area of the plurality of grid electrodes 203 in the low light-concentrated area II, and increases short-circuit current ($I_{sc}$) of the concentrated photovoltaic cell 20.

Figure 9:
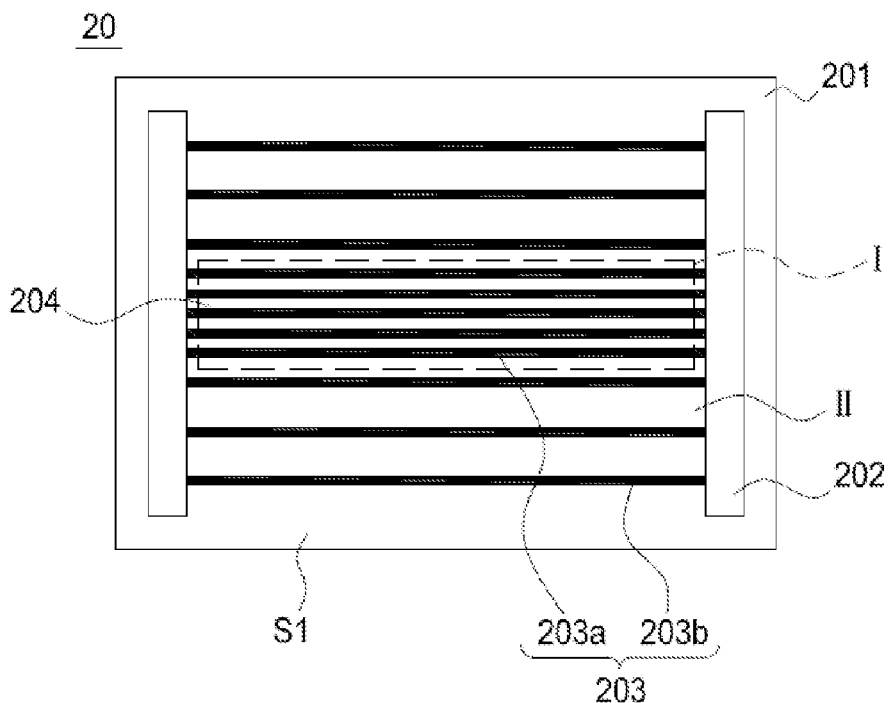
FIG. 9 illustrates a top-viewed diagram of a concentrated photovoltaic cell in accordance with a third embodiment of the present application.
Figure 10:
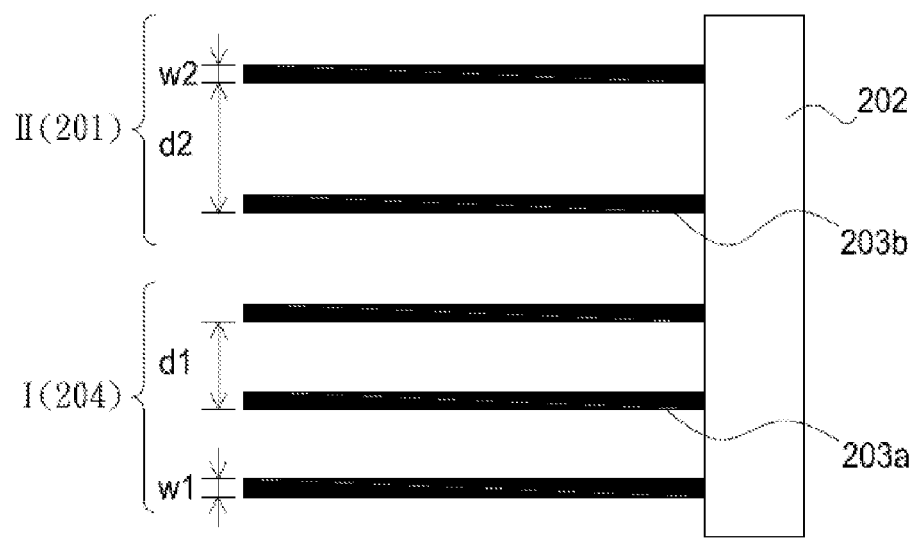
FIG. 10 illustrates a partial enlargement of a top-viewed diagram of a concentrated photovoltaic cell in accordance with a third embodiment of the present application.

FIG. 9 illustrates a top-viewed diagram of a concentrated photovoltaic cell 20 in accordance with a third embodiment of the present application. FIG. 10 illustrates a partial enlargement of a top-viewed diagram of a plurality of grid electrodes 203 shown in FIG. 9. As shown in FIG. 10, the pitch d1 of a plurality of grid electrodes 203a in the first electrode area 204 (the high light-concentrated area I) is smaller than the pitch d2 of a plurality of grid electrodes 203b in the second electrode area 201 (the low light-concentrated area II). The pitch d1 of the plurality of grid electrodes 203a in the first electrode area 204 (the high light-concentrated area I) is larger than 50 μm, preferably larger than 90 μm. The pitch d2 of the plurality of grid electrodes 203b in the second electrode area 201 (the low light-concentrated area II) is smaller than 300 μm, preferably smaller than 200 μm. In the embodiment, the width w1 of the plurality of grid electrodes 203a in the first electrode area 204 is equal to the width w2 of the plurality of grid electrodes 203b in the second electrode area 201. In the embodiment, the pitch d2 of the plurality of grid electrodes 203 in the second electrode area 201 is larger than the pitch d1 of the plurality of grid electrodes 203 in the first electrode area 204, which reduces light shielding area of the plurality of grid electrodes 203 in the low light-concentrated area II, and increases short-circuit current ($I_{sc}$) of the concentrated photovoltaic cell 20.

Figure 11:
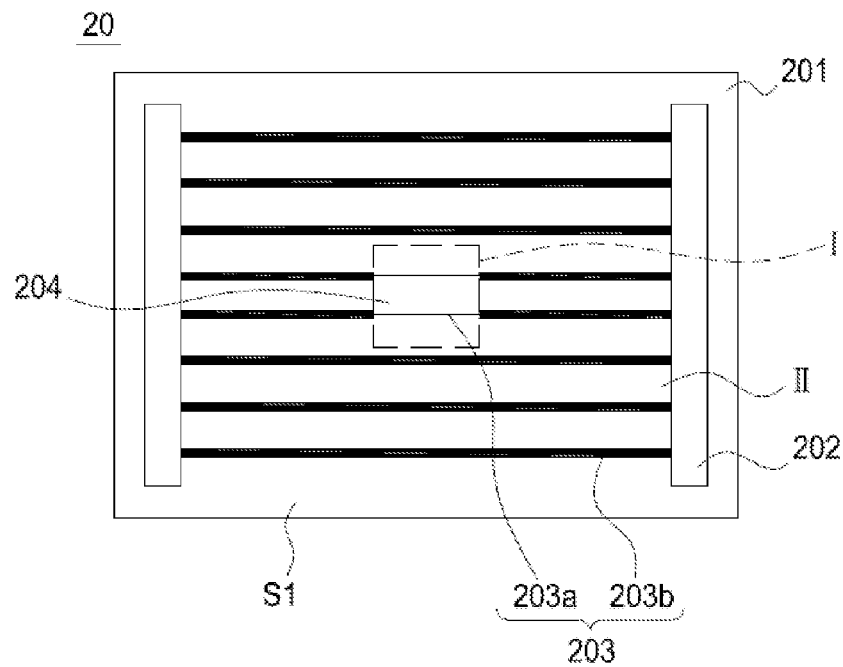
FIG. 11 illustrates a top-viewed diagram of a concentrated photovoltaic cell in accordance with a fourth embodiment of the present application.
Figure 12:
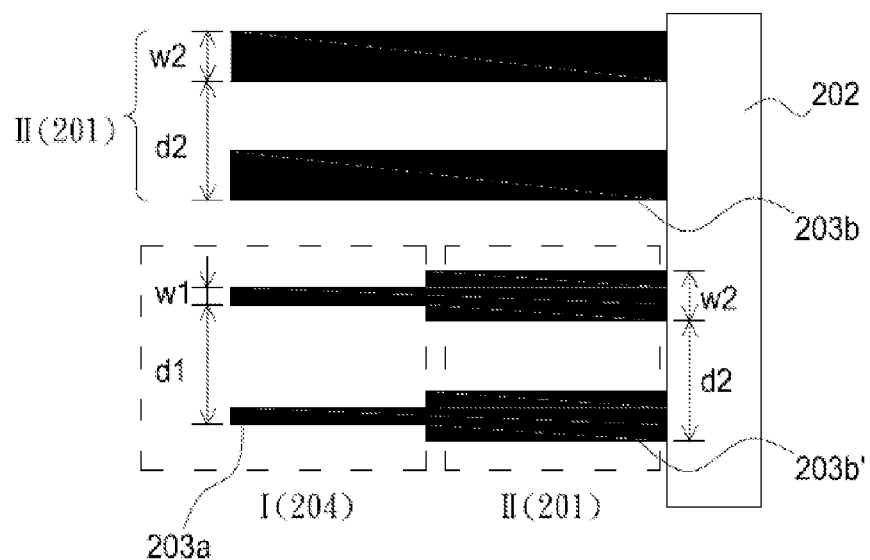
FIG. 12 illustrates a partial enlargement of a top-viewed diagram of a concentrated photovoltaic cell in accordance with a fourth embodiment of the present application.

FIG. 11 illustrates a top-viewed diagram of a concentrated photovoltaic cell 20 in accordance with a fourth embodiment of the present application. FIG. 12 illustrates a partial enlargement of a top-viewed diagram of a plurality of grid electrodes 203 shown in FIG. 11. As shown in FIG. 12, the pitch d1 of a plurality of grid electrodes 203a in the first electrode area 204 (the high light-concentrated area I) is equal to the pitch d2 of a plurality of grid electrodes 203b in the second electrode area 201 (the low light-concentrated area II). The pitch d1 of the plurality of grid electrodes 203a in the first electrode area 204 or the pitch d2 of the plurality of grid electrodes 203b in the second electrode area 201 is between 50 μm~300 μm, preferably between 90 μm~200 μm. The width w1 of the plurality of grid electrodes 203a in the first electrode area 204 is smaller than the width w2 of the plurality of grid electrodes 203b in the second electrode area 201. In the embodiment, the plurality of grid electrodes 203b' in the second electrode area 201 is connected to the collector electrode 202 and extends towards a direction away from the collector electrode 202, and the plurality of grid electrodes 203b' is connected to the grid electrode 203a in the first electrode area 204. In other words, one side of the grid electrode 203b' in the second electrode area 201 is connected to the collector electrode 202, and another side of the grid electrode 203b' is connected to the grid electrode 203a in the first electrode area 204. The width w2 of the grid electrode 203b' is larger than the width w1 of the grid electrode 203a, which reduces resistance loss when the photo-induced current flows from the high light-concentrated area I to the low light-concentrated area II.

Figure 13:
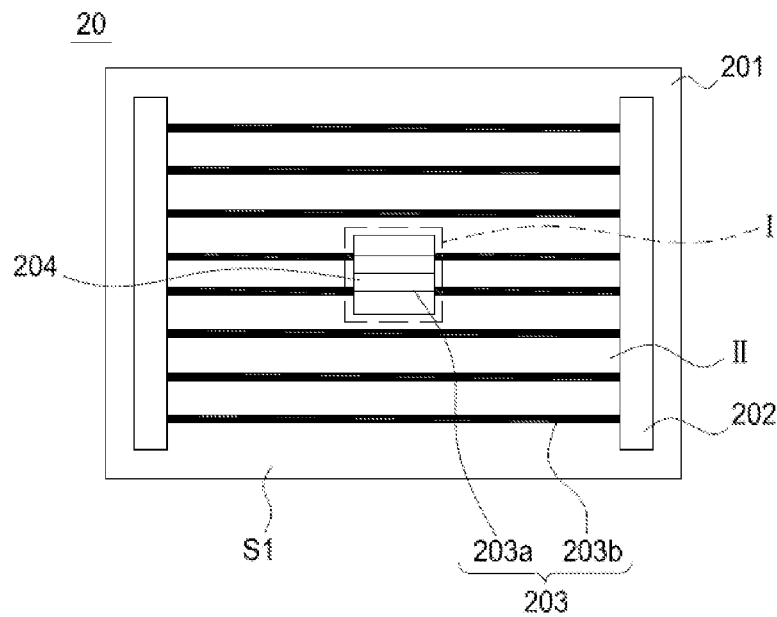
FIG. 13 illustrates a top-viewed diagram of a concentrated photovoltaic cell in accordance with a fifth embodiment of the present application.
Figure 14:
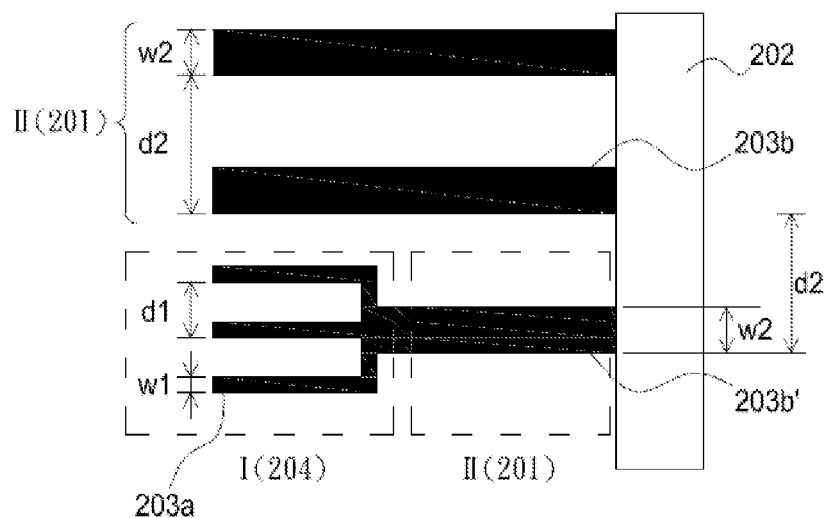
FIG. 14 illustrates a partial enlargement of a top-viewed diagram of a concentrated photovoltaic cell in accordance with a fifth embodiment of the present application.

FIG. 13 illustrates a top-viewed diagram of a concentrated photovoltaic cell 20 in accordance with a fifth embodiment of the present application. FIG. 14 illustrates a partial enlargement of a top-viewed diagram of a plurality of grid electrodes 203 shown in FIG. 13. As shown in FIG. 14, the pitch d1 of a plurality of grid electrodes 203a in the first electrode area 204 (the high light-concentrated area I) is smaller than the pitch d2 of a plurality of grid electrodes 203b in the second electrode area 201 (the low light-concentrated area II). The pitch d1 of the plurality of grid electrodes 203a in the first electrode area 204 (the high light-concentrated area I) is larger than 50 μm, preferably larger than 90 μm. The pitch d2 of the plurality of grid electrodes 203b in the second electrode area 201 (the low light-concentrated area II) is smaller than 300 μm, preferably smaller than 200 μm. The width w1 of the plurality of grid electrodes 203a in the first electrode area 204 is smaller than the width w2 of the plurality of grid electrodes 203b in the second electrode area 201. In the embodiment, the plurality of grid electrodes 203b' in the second electrode area 201 is connected to the collector electrode 202 and extends towards a direction away from the collector electrode 202, and the grid electrodes 203b' are respectively connected to the grid electrodes 203a in the first electrode area 204. In other words, one side of the grid electrode 203b' in the second electrode area 201 is connected to the collector electrode 202, and another side of the grid electrode 203b' is connected to the grid electrode 203a in the first electrode area 204. The width w2 of the grid electrode 203b' is larger than the width w1 of the grid electrode 203a, which reduces resistance loss when the photo-induced current flows from the high light-concentrated area I to the low light-concentrated area II.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A photovoltaic cell, comprising:
a semiconductor stack comprising an upper surface and a lower surface opposite to the upper surface; and
an upper electrode comprising a plurality of grid electrodes formed on the semiconductor stack and comprising first group grid electrodes and second group grid electrodes, wherein the first group grid electrodes are closer to a center of the upper surface than the second group grid electrodes are to the center of the upper surface, and the second group grid electrodes surround the first group grid electrodes, wherein the first group grid electrodes comprise a pitch smaller than that of the second group grid electrodes, or each of the first group grid electrodes comprises a uniform width smaller than that of each of the second group grid electrodes, wherein the upper electrode comprises a plurality of collector electrodes and the plurality of grid electrodes is formed between the plurality of collector electrodes; wherein the plurality of collector electrodes and the plurality of grid electrodes are perpendicular to each other, and the grid electrodes are parallel to each other.

2. The photovoltaic cell of claim 1, further comprising an optical concentrator disposed on the semiconductor stack to receive and deliver a light onto the upper surface of the semiconductor stack, wherein the light has a light intensity distribution having a high light-concentrated area close to the center of the upper surface and a low light-concentrated area close to an edge of the upper surface, wherein the high light-concentrated area comprises a concentration magnification larger than that of the low light-concentrated area.

3. The photovoltaic cell of claim 2, wherein a ratio of the high light-concentrated area and the upper surface is not larger than 80%.

4. The photovoltaic cell of claim 2, wherein the first group grid electrodes correspond to the high light-concentrated area and the second group grid electrodes correspond to the low light-concentrated area.

5. The photovoltaic cell of claim 1, wherein the pitch of the first group grid electrodes is larger than 50 μm and is smaller than 300 μm.

6. The photovoltaic cell of claim 1, wherein the plurality of collector electrodes has a width larger than 50 μm.

7. The photovoltaic cell of claim 1, further comprising an anti-reflective layer formed on the upper surface of the semiconductor stack, wherein the anti-reflective layer comprises a dielectric material.

8. The photovoltaic cell of claim 1, further comprising a lower electrode formed on the lower surface of the semiconductor stack.

9. The photovoltaic cell of claim 1, wherein the semiconductor stack comprises group III-V material, wherein the semiconductor stack comprises a sub cell operable to absorb and convert light into an electrical current.

10. The photovoltaic cell of claim 1, wherein the upper electrode is formed by lithography.

11. The photovoltaic cell of claim 1, wherein the first group grid electrodes are spaced apart from the second group grid electrodes.

12. The photovoltaic cell of claim 1, wherein the second group grid electrodes are directly connected to the plurality of collector electrodes.

13. The photovoltaic cell of claim 1, wherein one of the first group grid electrodes is connected to one of the second group grid electrodes.

14. The photovoltaic cell of claim 1, wherein multiple of the first group grid electrodes are connected to one of the second group grid electrodes.

15. The photovoltaic cell of claim 1, wherein the first group grid electrodes and the second group grid electrodes are arranged in a concentric form.

* * * * *